United States Patent
Li (10) Patent No.: US 12,125,776 B2
(45) Date of Patent: Oct. 22, 2024

(54) METHOD FOR FORMING SEMICONDUCTOR PACKAGE AND SEMICONDUCTOR PACKAGE

(71) Applicant: Yibu Semiconductor Co., Ltd., Shanghai (CN)

(72) Inventor: Weiping Li, Shanghai (CN)

(73) Assignee: Yibu Semiconductor Co., Ltd., Shanghai (CN)

( * ) Notice: Subject to any disclaimer, the term of this patent is extended or adjusted under 35 U.S.C. 154(b) by 129 days.

(21) Appl. No.: 17/562,936

(22) Filed: Dec. 27, 2021

(65) Prior Publication Data
US 2022/0208669 A1     Jun. 30, 2022

(30) Foreign Application Priority Data

Dec. 25, 2020   (CN) .......................... 202011559083.X (51) Int. Cl.
*H01L 23/538* (2006.01)
*H01L 21/48* (2006.01)
(Continued)

(52) U.S. Cl.
CPC ...... *H01L 23/49833* (2013.01); *H01L 21/486* (2013.01); *H01L 23/5381* (2013.01);
(Continued)

(58) Field of Classification Search
CPC ............ H01L 2224/11903; H01L 2224/11901; H01L 2224/11902; H01L 2224/1401;
(Continued)

(56) References Cited

U.S. PATENT DOCUMENTS 8,294,265 B1   10/2012 Oh
8,836,146 B2    9/2014 Chou
(Continued)

FOREIGN PATENT DOCUMENTS

| CN | 107104096 A | 8/2017 |
| CN | 210296353 U | 4/2020 |
| KR | 20060100263 | 9/2006 |

OTHER PUBLICATIONS

Shanghai Yibu Semiconductor Co., Ltd., CN First Office Action, CN202011559083.X, Mar. 1, 2022, 10 pgs.
(Continued)

*Primary Examiner* — Nicholas J Tobergte
*Assistant Examiner* — William Henry Anderson
(74) *Attorney, Agent, or Firm* — USCH Law, PC (57) ABSTRACT

The present disclosure provides a method for forming a semiconductor package and the semiconductor package. The method comprises attaching an interconnect device to a semiconductor substrate, and flip-chip mounting at least two chips over the interconnect device and the semiconductor substrate. Each chip includes at least one first bump of a first height and at least one second bump of a second height formed on a front surface hereof, the second height being greater than the first height. The method further comprises bonding the at least one second conductive bump of each of the at least two chips to the upper surface of the semiconductor substrate and bonding the first conductive bump of each of the at least two chips to the upper surface of the interconnect device Thus, the method uses a relatively simple and low cost packaging process to achieve high-density interconnection wiring in a package.

14 Claims, 6 Drawing Sheets

(51) Int. Cl.
  *H01L 23/00* (2006.01)
  *H01L 23/498* (2006.01)
  *H01L 25/00* (2006.01)
  *H01L 25/065* (2023.01)
  *H01L 23/14* (2006.01)
  *H01L 23/15* (2006.01)

(52) U.S. Cl.
  CPC .............. *H01L 24/11* (2013.01); *H01L 24/14* (2013.01); *H01L 25/0655* (2013.01); *H01L 25/50* (2013.01); *H01L 23/147* (2013.01); *H01L 23/15* (2013.01); *H01L 23/49816* (2013.01); *H01L 24/06* (2013.01); *H01L 24/13* (2013.01); *H01L 24/16* (2013.01); *H01L 24/80* (2013.01); *H01L 2224/0603* (2013.01); *H01L 2224/11462* (2013.01); *H01L 2224/11912* (2013.01); *H01L 2224/13083* (2013.01); *H01L 2224/13111* (2013.01); *H01L 2224/13139* (2013.01); *H01L 2224/13147* (2013.01); *H01L 2224/13155* (2013.01); *H01L 2224/1403* (2013.01); *H01L 2224/16145* (2013.01); *H01L 2224/16227* (2013.01); *H01L 2224/80895* (2013.01); *H01L 2224/80896* (2013.01)

(58) Field of Classification Search
  CPC ..... H01L 2224/1403; H01L 2224/1701; H01L 2224/1703; H01L 2224/81002; H01L 2224/95001; H01L 23/5381; H01L 25/0655
  See application file for complete search history.

(56) References Cited

U.S. PATENT DOCUMENTS

| | | | |
|---|---|---|---|
| 9,391,036 | B2 | 7/2016 | Matrumoto |
| 9,653,428 | B1 * | 5/2017 | Hiner .................... H01L 24/96 |
| 9,754,905 | B1 | 9/2017 | Misra |
| 10,535,608 | B1 * | 1/2020 | Rubin .................... H01L 24/73 |
| 2005/0167780 | A1 | 8/2005 | Edelstein et al. |
| 2006/0226527 | A1 * | 10/2006 | Hatano ............... H01L 23/5389 438/109 |
| 2007/0023919 | A1 * | 2/2007 | Lin ........................ H01L 24/12 257/E23.021 |
| 2007/0205520 | A1 | 9/2007 | Chou |
| 2008/0284048 | A1 | 11/2008 | Kim et al. |
| 2012/0196438 | A1 | 8/2012 | Chu |
| 2012/0241949 | A1 | 9/2012 | Sasaki |
| 2014/0070408 | A1 | 3/2014 | So |
| 2016/0143139 | A1 * | 5/2016 | Sorimachi ............... H01L 25/50 361/772 |
| 2019/0115319 | A1 * | 4/2019 | Hiner .................... H01L 21/563 |
| 2019/0326245 | A1 | 10/2019 | Baello |
| 2020/0020634 | A1 * | 1/2020 | Tsai ....................... H01L 24/73 |
| 2020/0020655 | A1 | 1/2020 | Tsai |
| 2021/0020605 | A1 * | 1/2021 | Hiner .................... H01L 24/96 |
| 2021/0193577 | A1 * | 6/2021 | Lin ...................... H01L 21/6835 |
| 2021/0249335 | A1 | 8/2021 | Krutsch |
| 2021/0288025 | A1 | 9/2021 | Arvin |
| 2022/0199539 | A1 * | 6/2022 | Karhade ........... H01L 23/49822 |
| 2023/0154893 | A1 * | 5/2023 | Hiner .................... H01L 24/96 257/737 |
| 2023/0420376 | A1 * | 12/2023 | Karhade ........... H01L 23/49816 |

OTHER PUBLICATIONS

Shanghai Yibu Semiconductor Co., Ltd., TW First Office Action and Search Report, TW110148251, Jun. 27, 2022, 19 pgs.
Shanghai Yibu Semiconductor Co., Ltd., TW First Office Action and Search Report, TW 110144183, Apr. 19, 2022, 6 pgs.
Shanghai Yibu Semiconductor Co., Ltd., TW Second Office Action, TW 110144183, Sep. 15, 2022, 6 pgs.
Shanghai Yibu Semiconductor Co., Ltd., KR First Office Action (English Translation), KR 10-2021-0164048, Nov. 6, 2023, 9 pgs.
Shanghai Yibu Semiconductor Co., Ltd., KR First Office Action (English Translation), KR10-2021-0171515, Dec. 3, 2021, 5 pgs.
Cu pillar bump development for the assembly of high-performance fine-pitch flip chips, LB Semiconductor Co., Ltd. (published on Jul. 2013).

* cited by examiner

METHOD FOR FORMING SEMICONDUCTOR PACKAGE AND SEMICONDUCTOR PACKAGE

CROSS REFERENCE TO RELATED APPLICATIONS

The present application claims the benefit of priority under the Paris Convention to Chinese Patent Application No. 202011559083.X, filed Dec. 25, 2020, entitled "Method for Forming Semiconductor Package and Semiconductor Package," which is hereby incorporated by reference in its entirety. The present application is related to U.S. patent application Ser. No. 17/535,988, filed Nov. 26, 2021, entitled "Method for Forming Semiconductor Package and Semiconductor Package," which is incorporated herein by reference in its entirety.

FIELD OF THE INVENTION

The present application is related to the field of semiconductors, and particularly to a method for forming a semiconductor package and the semiconductor package.

BACKGROUND

This section is intended to provide a background or context for the embodiments described herein and the invention recited in the claims. The description in this section is not admitted to be prior art by its inclusion in this section.

With the rapid development in the semiconductor industry, the demand for miniaturization and complexity of electronic products is increasing, and the demand for high-density interconnection inside the semiconductor package is also increasing.

Conventionally, in order to realize high-density wiring function of a semiconductor package, an EMIB (Embedded Multi-Die Interconnect Bridge) packaging technology is adopted, which uses a plurality of RDL layers on top of an interconnection bridge to interconnect a plurality of dies by embedding the interconnection bridge in a ball grid array (BGA) laminated substrate. Such a packaging process requires a cavity to be formed in a conventional BGA laminated substrate to accommodate the interconnection bridges with various sizes, resulting in high manufacturing costs.

SUMMARY

In view of the above-described problems of the prior art, a method of forming a semiconductor package and a semiconductor package have been proposed, and the above-described problems can be solved according to some embodiments.

According to some embodiments, a method of forming a semiconductor package comprises attaching an interconnect device to a semiconductor substrate; and flip-chip mounting at least two chips over the interconnect device and the semiconductor substrate. In some embodiments, each respective chip of the at least two chips includes at least one first conductive bump of a first height and at least one second conductive bump of a second height formed on a front surface of the respective chip, and the second height is greater than the first eight. In some embodiments, flip-chip mounting the at least two chips over the interconnect device and the semiconductor substrate includes bonding the at least one second conductive bump of each of the at least two chips to the semiconductor substrate and bonding the at least one first conductive bump of each of the at least two chips to the interconnect device.

In some embodiments, the method further comprises, prior to attaching the interconnect device over the semiconductor substrate, forming the interconnect device. In some embodiments, forming the interconnect device includes: providing a silicon wafer having a first side and an opposing second side; forming a redistribution layer structure on the first side of the silicon wafer; forming a plurality of first bonding pads on the redistribution layer structure; thinning the silicon wafer from the second side thereof to a thickness corresponding to a height difference between the at least one first conductive bump and the at least one second conductive bump; and dicing the thinned silicon wafer to form the interconnection device.

In some embodiments, the method further comprises forming vertical through-silicon vias between the first side and the second side of the silicon wafer.

In some embodiments, thinning the silicon wafer from the second side comprises: temporarily adhering the first side of the silicon wafer to a support wafer to support the silicon wafer during thinning; and removing the support wafer after thinning. In some embodiments, the support wafer is a silicon wafer or a glass substrate.

In some embodiments, attaching the interconnect device to the semiconductor substrate comprises attaching the interconnect device to a surface of the semiconductor substrate using a hybrid bonding process.

In some embodiments, the method further comprises forming the at least first conductive bump and the at least one second conductive bump on each of the at least two chips including: providing a semiconductor wafer having at least one semiconductor device formed thereon, the at least one semiconductor device including a plurality of metal bond pads, the plurality of metal bond pads including a first metal bond pad and a second metal bond pad; forming a seed layer over the at least one semiconductor device, the seed layer being electrically connected to each of the plurality of metal bond pads; forming a first photoresist layer over the seed layer, the first photoresist layer having a first thickness; forming a first set of openings in the first photoresist layer, the first set of openings including a first opening exposing a first portion of the seed layer directly over at least a portion of the first metal bond pad of the a plurality of metal bond pads; forming a first metal feature of a first height in the first opening, the first height corresponding to the first thickness; removing the first photoresist layer; forming a second photoresist layer over the seed layer after removing the first photoresist layer, the second photoresist layer having a second thickness different from the first thickness; forming a second set of openings in the second photoresist layer, the second set of openings including a second opening exposing a second portion of the seed layer directly over at least a portion of the second metal bond pad of the plurality of metal bond pads; forming a second metal feature of a second height in the second opening, the second height corresponding to the second thickness; removing the second photoresist layer; and etching away exposed portions of the seed layer after removing the second photoresist layer.

In some embodiments, the method further comprises, before forming the seed layer, forming a patterned passivation layer over the semiconductor wafer and the plurality of metal bond pads, the passivation layer exposing at least a portion of each of the metal bond pads, wherein the seed layer subsequently covers exposed portion of each of the metal bond pads; and after forming the patterned passivation layer, forming a polymer layer on the passivation layer.

In some embodiments, forming the second photoresist layer over the seed layer includes, after the removing the first photoresist layer, forming the second photoresist layer over the seed layer to completely cover the first metal feature.

In some embodiments, the first metal feature and the second metal feature include under-bump metal.

In some embodiments, the second metal bond pad is larger in size than the first metal bond pad.

In some embodiments, after flip-chip mounting the at least two chips to the semiconductor substrate and the upper surface of the interconnect device, the method further comprises: attaching a cap over the semiconductor substrate, the cap housing the interconnect device and the at least two chips therein; and forming a ball grid array under the semiconductor substrate, the ball grid array configured to bond the semiconductor substrate to a PCB board.

In some embodiments, the interconnect device includes segmented portion of a silicon wafer or a glass substrate.

According to some embodiments, a semiconductor package comprises a semiconductor substrate, an interconnect device attached to an upper surface of the semiconductor substrate, and at least two chips flip-chip mounted over the upper surface of the interconnect device and the upper surface of the semiconductor substrate. In some embodiments, each respective chip of the at least two chips includes at least one first conductive bump having a first height and at least one second conductive bump having a second height formed on a front surface of the respective chip, and the second height is greater than the first height. In some embodiments, the at least one second conductive bump of each of the at least two chips is bonded to the upper surface of the semiconductor substrate and the at least one first conductive bump of each of the at least two chips is bonded to the upper surface of the interconnect device.

In some embodiments, the interconnect device comprises: a silicon layer having opposing first and second sides; a redistribution layer structure formed on the first side of the silicon layer; a plurality of first bonding pads formed on the redistribution layer structure. In some embodiments, a thickness of the interconnect device correspond to a height difference between the at least one first conductive bump and the at least one second conductive bump.

In some embodiments, the interconnect device further comprises vertical through silicon vias formed between the first side and the second side of the silicon layer.

In some embodiments, each of the at least one chip comprises: at least a first metal bonding pad; at least a second metal bonding pad; and a seed layer formed on each of the metal bonding pads. In some embodiments, the at least one first conductive bump having a first height is formed over the seed layer and directly over at least a portion of the at least one first metal bonding pad, and the at least one second conductive bump having a second height is formed over the seed layer and directly over at least a portion of the at least one second metal pad.

In some embodiments, the semiconductor substrate includes a plurality of second bond pads formed on the first side thereof, each of the at least one first conductive bump of each of the at least two chips is bonded to a corresponding first bond pad of the interconnect device, and each of the at least one second conductive bump of each of the at least two chips is bonded to a corresponding second bond pad of the semiconductor substrate.

In some embodiments, the at least one first conductive bump and the at least one second conductive bump include under bump metal.

In some embodiments, the package further comprises a cap over the semiconductor substrate, the cap housing the interconnect and the at least two chips therein; and a grid array formed under the semiconductor substrate and configured to bond the package to a PCB board.

In some embodiments, the interconnect device includes a segmented portion of a silicon wafer or glass substrate.

The above description is an overview of the technical solutions described herein. In order to make the aforementioned and other objects, features and advantages of the technical solutions comprehensible, embodiments accompanied with figures are described in detail below.

BRIEF DESCRIPTION OF THE DRAWINGS

The advantages and benefits described herein, as well as other advantages and benefits, will be apparent to those of ordinary skill in the art upon reading the following detailed description of the exemplary embodiments. The drawings are only for purposes of illustrating exemplary embodiments and are not to be construed as limiting the invention. Also, like reference numerals are used to refer to like elements throughout.

In the drawings, the same or corresponding reference numerals may indicate the same or corresponding parts.

DETAILED DESCRIPTION OF THE EMBODIMENTS

Some embodiments and features of the embodiments may be combined with each other without conflict. Some embodiments will be described in more detail below with reference to the accompanying drawings. While some embodiments are shown in the drawings, it should be understood that possible embodiments can be in various forms and should not be limited to the embodiments set forth herein. Rather, these embodiments are provided so that this disclosure will be thorough and complete, and will fully convey the scope of the disclosure to those skilled in the art.

The following disclosure provides various embodiments, or examples, for implementing various features. Specific examples of components and arrangements are described below to simplify the present disclosure. These are, of course, merely examples and are not intended to limit the invention. Further, the present application may repeat reference numerals and/or characters in the various embodiments. This repetition is for the purpose of simplicity and clarity and does not in itself dictate a relationship between the various embodiments and/or configurations discussed.

It will be understood that terms such as "including" or "having," or the like, are intended to indicate the presence of the disclosed features, integers, steps, acts, components, parts, or combinations thereof, and are not intended to preclude the presence or addition of one or more other features, integers, steps, acts, components, parts, or combinations thereof.

Also, spatially relative terms, such as "under . . . ," "below . . . ," "lower," "above . . . ," "upper," and the like, may be used herein for ease of description to describe one element or component's relationship to another element (or other) component as illustrated. Spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly.

It should be noted that the embodiments and features of the embodiments may be combined with each other if no conflict results from the combination. Some embodiments will be described in detail below with reference to the attached drawings.

Figure 1:
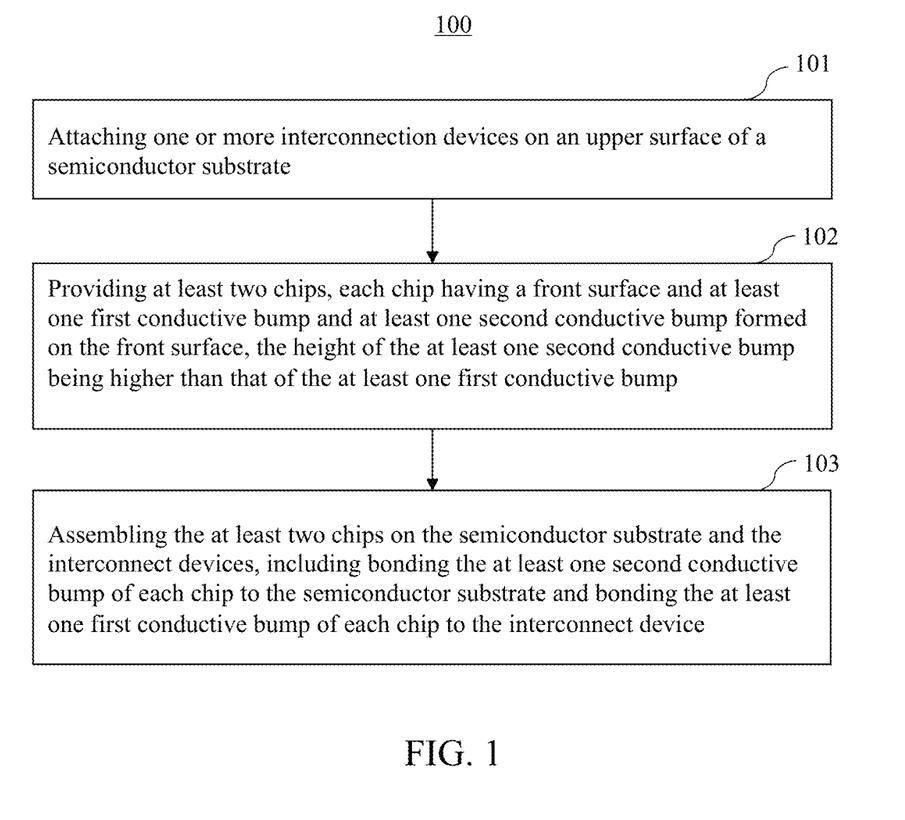
FIG. 1 is a schematic flow chart diagram illustrating a method of forming a semiconductor package according to some embodiments.
Figure 2:
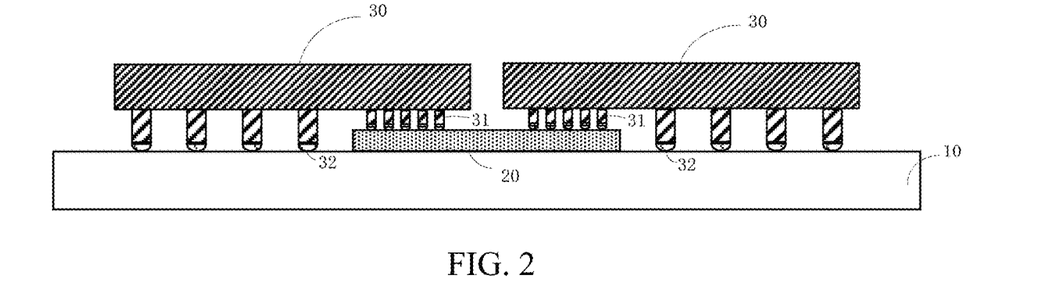
FIG. 2 is a schematic structural diagram illustrating a semiconductor package according to some embodiments.

FIG. 1 is a flowchart illustrating a method 100 including steps 101-103 for forming semiconductor package(s) according to some embodiments. FIG. 2 illustrates a schematic structural view of an exemplary semiconductor package formed according to the method illustrated in FIG. 1. The method of forming a semiconductor package according to some embodiments is described below with reference to FIGS. 1 and 2.

In Step 101, a semiconductor substrate 10 is provided, and one or more interconnect devices 20 are assembled over the semiconductor substrate 10.

In some embodiments, the semiconductor substrate 10 may be a regular Laminate Buildup Substrate. The semiconductor substrate 10 may include a bottom surface having a plurality of ball grid array (BGA) pads formed thereon, an upper surface having a solder precoat formed thereon, and laser blind vias and/or plated through-holes formed between the BGA pads and the solder precoat. In some embodiments, a bottom surface of an interconnect device 20 may be attached to the semiconductor substrate 10 with a Die attach film (Die attach film).

In Step 102, at least two chips 30 are provided. At least one first conductive bump 31 and at least one second conductive bump 32 are formed on a front side (or a front surface) of each chip, and the height of the at least one second conductive bump 32 is higher than that of the at least one first conductive bump 31.

In some embodiments, the first conductive bumps 31 and the second conductive bumps formed on the front surface of each chip are distributed in different areas of the surface.

In Step 103, the at least two chips 30 are assembled on the semiconductor substrate 10 and the interconnect device 20, such that the at least one second conductive bump 32 of each chip 30 is bonded to the semiconductor substrate 10 and the at least one first conductive bump 31 of each chip is bonded to the interconnect device 20. In some embodiments, the at least two chips 30 are assembled on the upper surface of the semiconductor substrate 10 and the upper surfaces of the interconnect device 20, such that the at least one second conductive bump 32 of each chip 30 is bonded to the upper surface of the semiconductor substrate 10 and the at least one first conductive bump 31 of each chip is bonded to the upper surface of the interconnect device 20.

In some embodiments, the upper surface of the interconnect device 20 is formed with a plurality of first bond pads (not shown), the upper surface of the semiconductor substrate 10 is formed with a plurality of second bond pads (not shown), and step 103 may include: flip-chip mounting the at least two chips 30 over the semiconductor substrate 10 and the interconnect device 20 such that a plurality of first conductive bumps 31 of each chip 30 are respectively bonded to the plurality of first bond pads of the interconnect device 20, while a plurality of second conductive bumps 32 of each chip are respectively bonded to the plurality of second bond pads on the upper surface of the semiconductor substrate 10.

In some embodiments, bonding the first conductive bumps 31 to the first bond pads and bonding the second conductive bumps 32 to the second bond pads may be achieved using a thermocompression bonding technique.

In some embodiments, the first conductive bumps 31 and the second conductive bumps 32 include under-bump metal (UBM). In some embodiments, conventional Wafer Level Packaging (WLP) techniques may be utilized to form a redistribution layer (RDL) over and electrically connect to active devices in a semiconductor wafer. External input/output (I/O) pads (pads), such as solder balls on the under-bump metal, may then be formed for electrical connection to the semiconductor wafer via the RDL.

Figure 3:
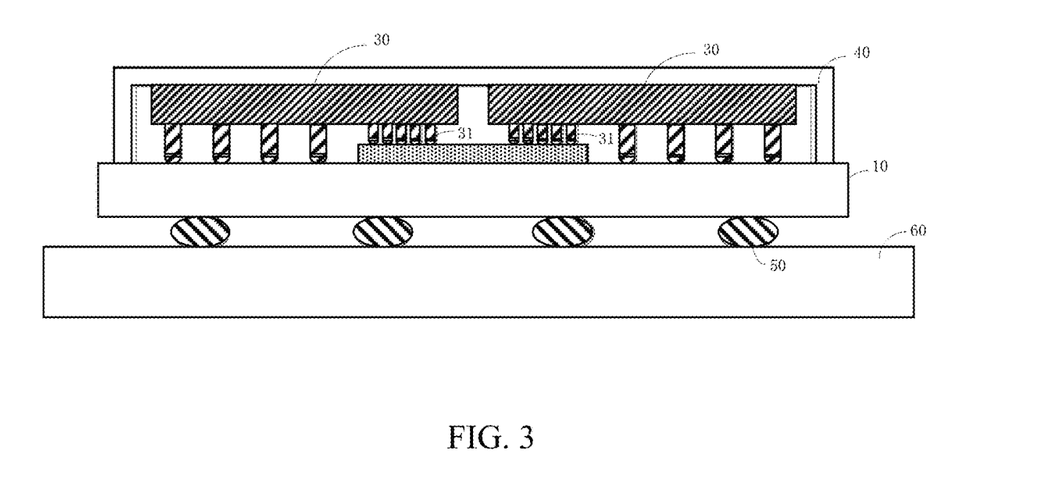
FIG. 3 is a schematic structural diagram illustrating a semiconductor package according to some embodiments.

In some embodiments, referring to FIG. 3, after step 103, the method according to some embodiments may further include attaching a cap 40 over the semiconductor substrate 10, the cap 40 housing the interconnect device 20 and the at least two chips 30 therein.

In some embodiments, an underfill (underfill) is used to fill in the voids between the semiconductor substrate, the chips and the interconnect devices.

In some embodiments, the method according to some embodiments further comprises forming a ball grid array 50 under the semiconductor substrate 10. The ball grid array 50 are electrically connected to the interconnect device(s) and chips assembled on the semiconductor substrate through vias or through holes in the semiconductor substrate, and can be used for bonding the formed package to a PCB board 60.

Figure 4A:
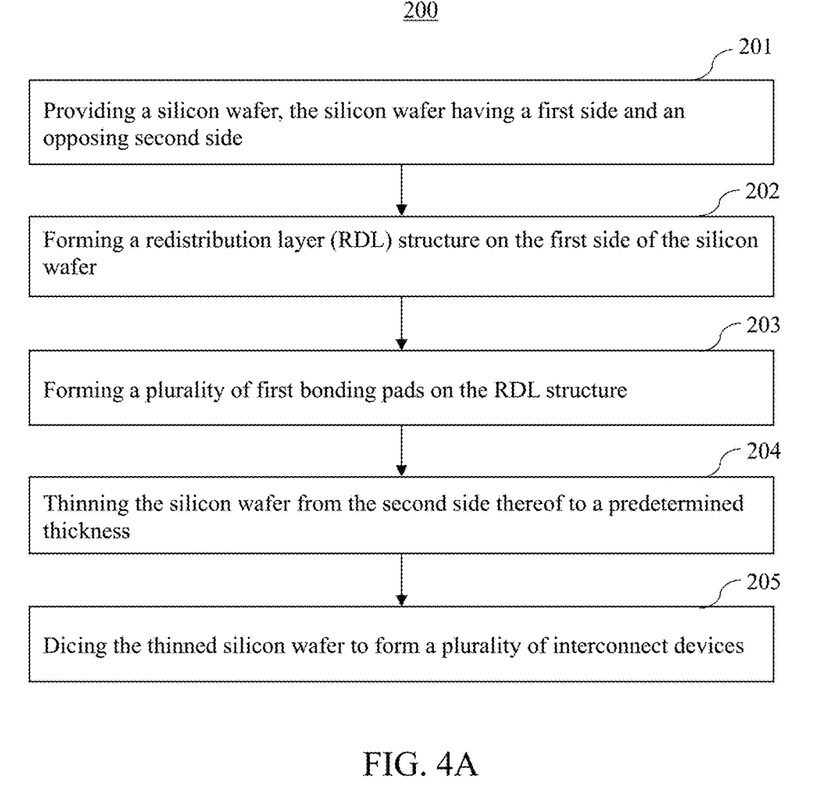
FIG. 4A is a flowchart illustrating a method of forming interconnect devices according to some embodiments.

FIG. 4A is a flowchart illustrating a method 200 of forming interconnect devices according to some embodiments.

Figure 4B:
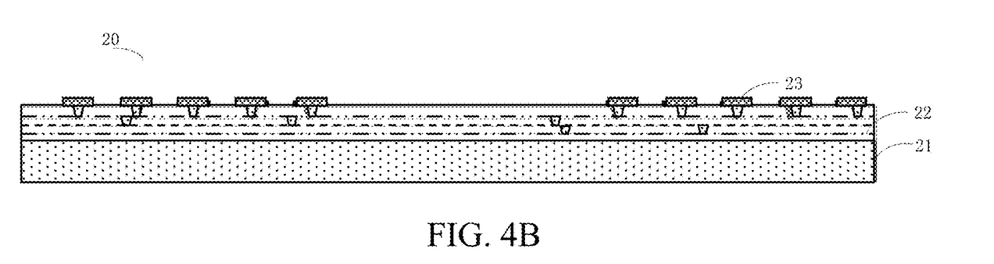
FIG. 4B is a schematic structural diagram illustrating an interconnect device according to some embodiments.

In some embodiments, as shown in FIG. 4A, steps 201-205 may be performed to form the interconnect device 20 before attaching the interconnect device 20 over the semiconductor substrate 10. FIG. 4B shows a schematic structural diagram illustrating an exemplary interconnect device 20, and steps 201-205 are described in detail below with reference to FIGS. 4A-4B.

In step 201, a silicon wafer (or a semiconductor wafer or glass substrate) 21 is provided, the silicon wafer 21 having a first side and a second side opposite to each other.

In step 202, a redistribution layer (RDL) structure 22 is formed on a first side of the silicon wafer 21. For example, the RDL structure may be formed on the first side of the silicon wafer by photolithography and electroplating.

In step 203, a plurality of first bond pads 23 are formed on the surface of the RDL structure 22. In some embodiments, the first bond pads may use a material including copper, aluminum, silver, gold, titanium, any combination thereof, or any other suitable material known in the art.

In step 204, the silicon wafer 21 is thinned from the second side thereof to a thickness corresponding to the height difference between the first conductive bump 31 and the second conductive bump 32. In some embodiments, thinning the silicon wafer 21 from the second side to reach the thickness of the finally formed interconnect device consistent with the height difference of the first and second conductive bumps may enable flip-chip mounting of the chip 30 having the first and second conductive bumps 31 and 32 with different heights over the semiconductor substrate 10 and the interconnect device 20. For example, a chemical mechanical polishing process, an etching process, or other methods may be used to remove portions of the silicon wafer material from the second side.

In step 205, the thinned silicon wafer is diced to form a plurality of interconnected devices.

In some embodiments, only one interconnect device is formed, and the interconnect device can be obtained without performing the dicing process.

Figure 4C:
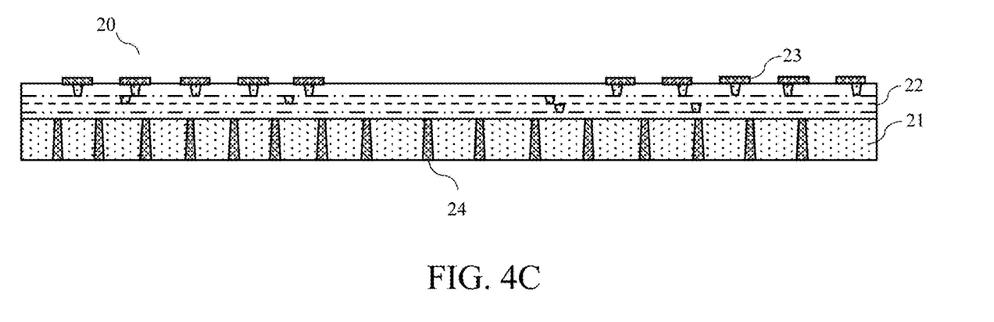
FIG. 4C is a schematic diagram illustrating a structure of an interconnect device according to some embodiments.

FIG. 4C is a schematic structural diagram illustrating another exemplary interconnect device according to some embodiments, including a plurality of vertical Through Silicon Vias (TSVs) 24 formed between the first side and the second side of the Silicon wafer 21. In some embodiments, a conventional TSV technology is employed to implement vertical electrical interconnection of through-silicon vias by filling etched through-holes with conductive materials such as copper, tungsten, polysilicon, etc., so that the interconnection length can be reduced by the vertical interconnection, thereby achieving miniaturization of device integration. In some embodiments, the second side of the interconnect device with vertical through-silicon-vias 24 may be attached above the semiconductor substrate using a Hybrid Bonding process, thereby achieving a smaller bump pitch, providing a higher interconnect density. In some embodiments, the attachment described above may also be achieved using a thermocompression bonding process.

In some embodiments, during formation of the interconnect device 20, when thinning the second side of the silicon wafer 21, a support wafer may be used to temporarily adhere to the first side of the silicon wafer 21 to support the silicon wafer 21 when thinning occurs. In some embodiments, the support wafer is a silicon wafer or glass. In some embodiments, if glass is used as the support wafer, the glass support wafer may be temporarily bonded to the first side of the silicon wafer 21 using an ultraviolet peelable temporary adhesive film and peeled off after the thinning step is completed.

In some embodiments, the interconnect device is made from a silicon wafer or semiconductor wafer or glass substrate and includes silicon or another semiconductor or glass.

Referring to FIG. 2, a plurality of first conductive bumps 31 and a plurality of second conductive bumps 32 are formed on a surface of one side of the chip 30, and the height of the second conductive bumps 32 is higher than that of the first conductive bumps 31.

Typically, while the pitch of the bumps formed on a chip surface can be adjusted and changed, the size of the bumps is usually fixed to a value, because, if the sizes of the bumps are not uniform, the large-sized bumps are usually plated faster than the small-sized bumps during the electroplating process, resulting in the height of the bumps to be uneven, and reducing the yield of chip fabrication.

In some embodiments, a solution is provided to overcome the technical difficulty in forming conductive bumps of different dimensions and heights on the same wafer. FIG. 5A-5J show schematic diagrams of various intermediate stages of a bump forming process, particularly illustrating an example of how to form at least one first conductive bump and at least one second conductive bump on a chip 30 as shown in FIG. 5J.

In some embodiment, various steps in the bump forming process is described in detail with reference to FIG. 5A to FIG. 5J. Similar steps can be used to form the plurality of first conductive bumps 31 and the plurality of second conductive bumps 32 on the chip 30, as shown in FIG. 2.

Figure 5A:
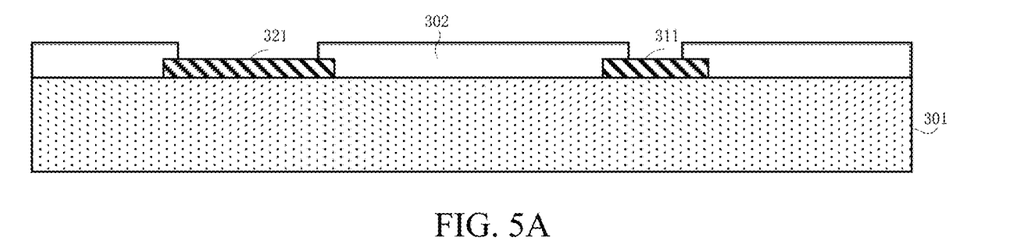
FIG. 5A to 5J are schematic cross-sectional views of a semiconductor device at various stages of a bumping process according to some embodiments.

As shown in FIG. 5A, a semiconductor device 301 is provided. In some embodiments, the semiconductor device 301 has a plurality of metal bond pads, including a first metal bond pad 311 and a second metal bond pad 321 shown in FIG. 5A, located at respective positions on the semiconductor device 301.

In some embodiments, the metal bond pads may include materials including copper, aluminum, silver, gold, titanium, any combination thereof, or any other suitable material known in the art. The metal bond pads may have different sizes, such as a first metal bond pad 311 having a smaller size and a second metal bond pad 321 having a larger size. The two metal bond pads having different sizes may be disposed on the silicon wafer at a certain distance from each other, and the metal bond pads do not contact each other.

In some embodiments, the at least one semiconductor device (e.g., integrated circuit chip) 301 may further include a patterned passivation layer 302 formed on the semiconductor device 301 and the plurality of metal bond pads. The passivation layer 302 has openings exposing at least a portion of each metal bond pad. In some embodiments, the passivation layer 302 covers a portion of the semiconductor device 301 and a portion of each metal bond pad. Referring to FIG. 5A, a passivation layer 302 may be formed over the semiconductor device 301. The passivation layer 302 covering edge portions of the first and second metal bond pads 311 and 321, and a patterned opening formed in the passivation layer 302 exposing a central portion of each metal bond pad. Passivation layer 302 may be formed using any suitable material including SiO2, SiNx, phosphosilicate glass (PSG), or any suitable material known in the art that is suitable for passivation on a chip surface. According to some embodiments, the patterned passivation layer 302 forms an opening over each metal bond pad.

Figure 5B:
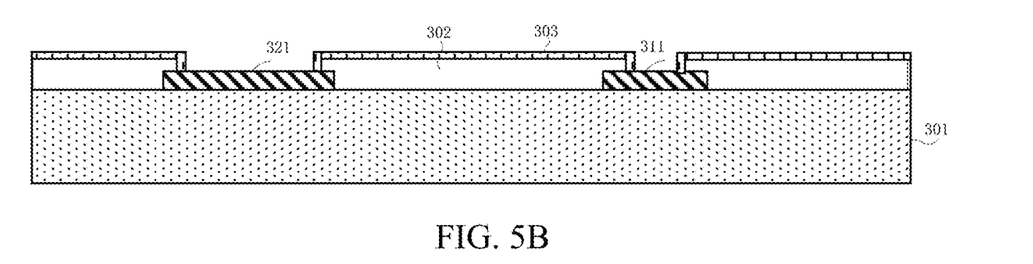

In some embodiments, as shown in FIG. 5B, a polymer layer 303 may be formed on the upper surface and the side surfaces of the passivation layer 302. The polymer layer 303 may include a photo-sensitive polymer formed of a material such as Polyimide (PI), Polybenzoxazole (PBO), benzocyclobutene (BCB), or any combination thereof, or any other suitable material known in the art. The polymer layer 303 may be coupled to the passivation layer 302 and in contact with the first and second metal bond pads 311, 321. The integrated circuit chip having the polymer layer 303 covering the passivation layer 302 has a very low leakage current, strong mechanical properties, and chemical resistance. Meanwhile, moisture can be effectively shielded, and the moisture resistance of the component is improved, so that the electrical performance of the chip is improved, and the production cost is reduced. Referring to FIG. 5B, a polymer layer 303 may cover exposed surfaces of the passivation layer 302, and the polymer layer 303 extends into the opening of the passivation layer 302 formed at each metal bond pad, while keeping a central portion of each metal bond pad in an exposed state.

Figure 5C:
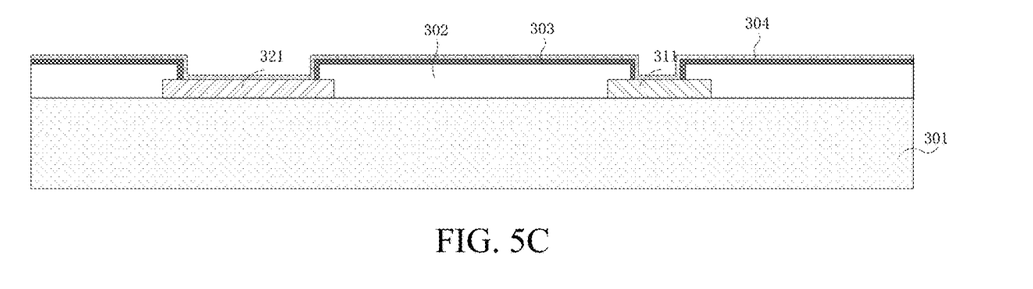

As shown in FIG. 5C, a seed layer 304 is formed over the semiconductor device. In some embodiments, the seed layer 304 is electrically connected to each metal bond pad.

According to some embodiments, seed layer 304 is a composite layer comprising a plurality of layers. For example, the seed layer 304 may include a titanium layer as a lower layer and a copper layer as an upper layer, thereby being electrically connected to each metal bond pad, respectively. According to an alternative embodiment, seed layer 304 may also be a single layer, for example, a copper layer. It will be appreciated that other suitable conductive materials may also be used for the seed layer 304.

In some embodiments, metallic material may be sputtered on exposed surfaces of the polymer layer 303 and the metal bond pads to form the seed layer 304, which seed layer 304 may include a titanium layer as a lower layer and a copper layer as an upper layer. It should be appreciated that the exposed surface of the seed layer 304 needs to be etched away in a subsequent packaging step to avoid circuit failure, as will be described below.

Figure 5D:
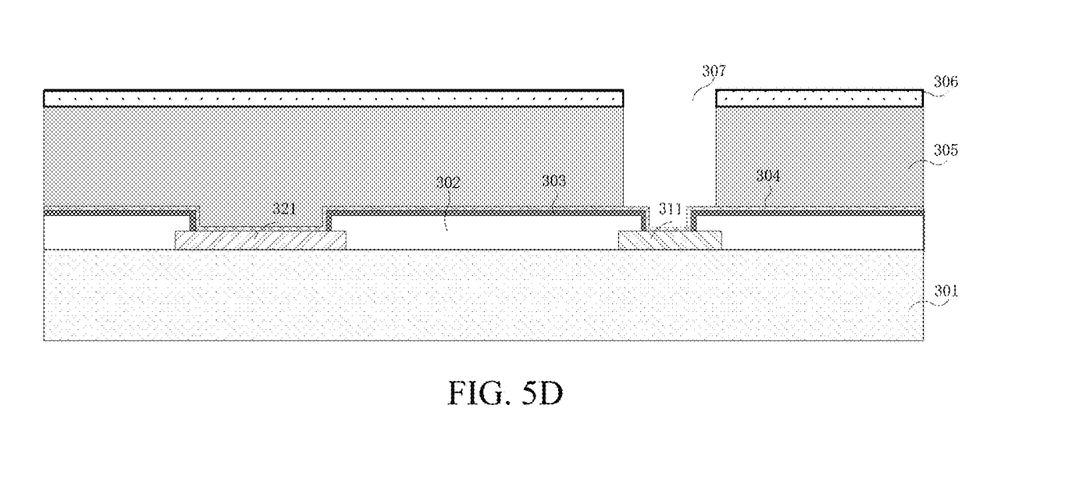

As shown in FIG. 5D, a first photoresist layer 305 is formed over the seed layer 304, and a first opening 307 is formed in the first photoresist layer 305 to expose the seed layer 304. In some embodiments, the first opening 307 is directly over at least a portion of the at least one first metal pad 311 of the at least two metal pads.

In some embodiments, referring to FIG. 5D, the first photoresist layer 305 having a first thickness may be deposited over the seed layer 304, and a first mask layer 306 for patterning the first photoresist layer 305 may be placed over the first photoresist layer 305 to form the first opening 307. In some embodiments, photoresist may be spun on the provided semiconductor device 301 and the seed layer 304 to form the first photoresist layer 305 of the first thickness, which may be determined according to a desired height dimension of a metal feature to be formed over the first metal bond pad 311. A first mask layer 306 is next placed over the first photoresist layer 305. The first mask layer 306 may be a photolithography mask including a transparent portion allowing light to pass therethrough and an opaque portion for blocking the light from passing therethrough. Afterwards, a light beam is projected on the first mask layer 306 to expose a portion of the first photoresist layer 305 directly under the transparent portion and not expose other portions of the first photoresist layer 305 directly under the opaque portion, thereby forming the first opening 307 after the exposed portion is cleaned off. An area of the first opening 307 may be determined according to a desired bottom size of an Under Bump Metal (UBM) for the first metal bond pad 311.

Figure 5E:
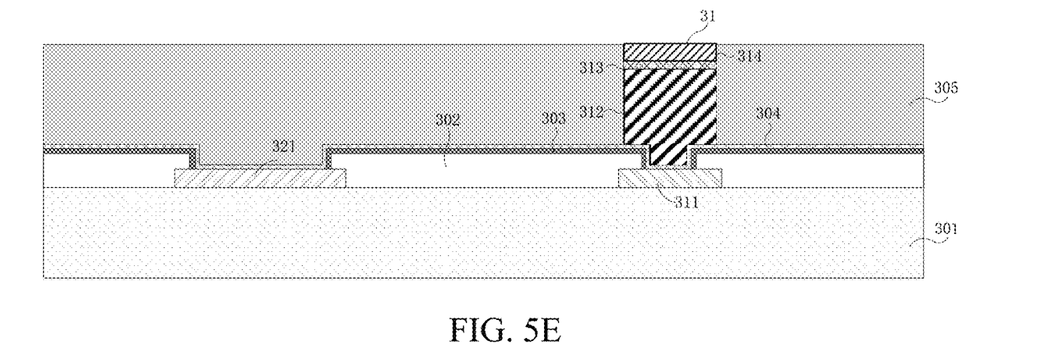

In some embodiments, referring to FIG. 5E, the first metal feature 31 may be a first Under-Bump Metal (UBM). Optionally, the first metal feature may also be other metal interfaces for providing electrical interconnection of the chip. The present embodiment is described by taking the under-bump metallization as an example but is not limit to this example.

Referring to FIG. 5E, a first under bump metal 31 of a first height is formed in the first opening 307 above the seed layer 304, typically by an electroplating process, in which the first opening 307 is filled with a metal material to form the first under bump metallization 61. In some embodiments, the first height is substantially equal to the first thickness of the first photoresist layer 305 at the opening. The bottom of the first under-bump metallization 31 is electrically connected to the first metal bond pad 311 through the seed layer 304. According to some embodiments, the step of forming the first under bump metal 31 may specifically include: forming a copper (Cu)-containing layer, such as a copper pillar 312, over the seed layer 304 and in the first opening 307 by electroplating, forming a nickel (Ni)-containing layer 313 over the copper (Cu)-containing layer 312, and forming a solder paste layer 314, such as a tin-silver compound layer (e.g., snag1.8%) over the nickel (Ni)-containing layer 313.

Figure 5F:
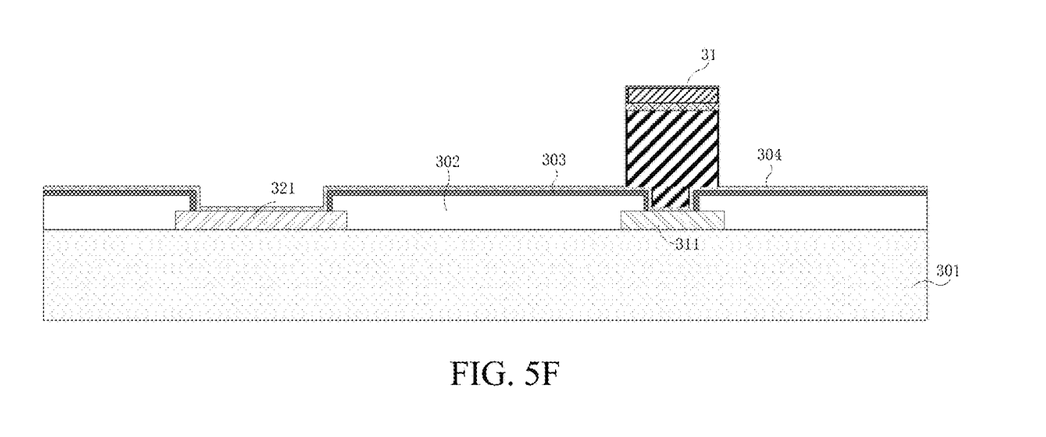

Afterwards, the first photoresist layer 305 is removed; for example, the first photoresist layer 305 may be removed in a photoresist stripping process and the resulting structure is shown in FIG. 5F.

Figure 5G:
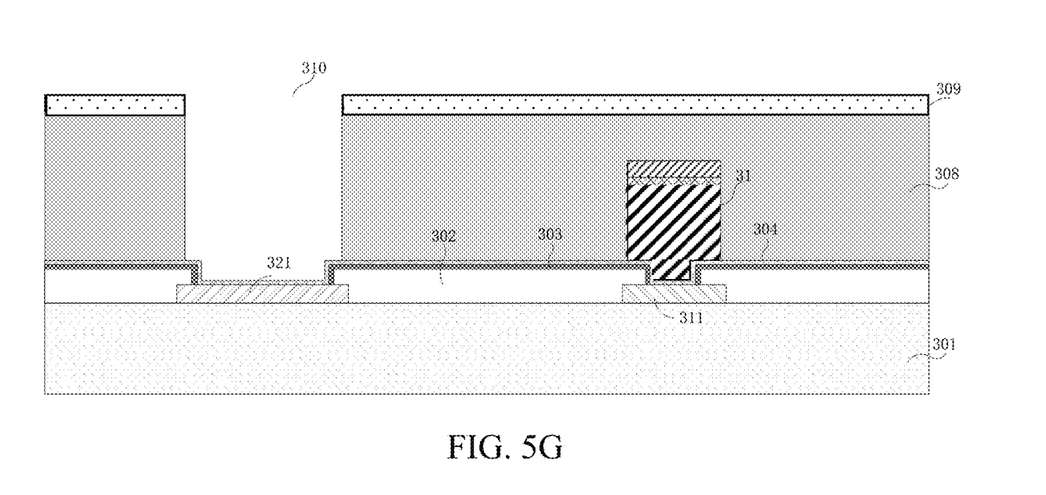

As shown in FIG. 5G, after removing the first photoresist layer 305, a second photoresist layer 308 is formed over seed layer 304. In some embodiments, the second photoresist layer 308 is formed over seed layer 304 to completely cover the first metal feature, which in the illustration is the first under-bump metal 31. In this case, the second photoresist layer 308 is higher than the first under bump metal 31, and thus it is covered and protected by the photoresist.

As also shown in FIG. 5G, a second opening 310 is formed in the second photoresist layer 308 to expose seed layer 304. In some embodiments, referring to FIG. 5G, the second opening 310 is located directly above at least a portion of the second metal bond pad 321.

In some embodiments, referring to FIG. 5G, in a same or similar process as the formation of the first opening 307, after removing first photoresist layer 305, a second photoresist layer 308 of a second thickness is deposited over seed layer 304, a second mask layer 309 is placed over the second photoresist layer 308 for patterning second photoresist layer 308, e.g., forming a second opening 310. Specifically, after removing first photoresist layer 305, photoresist is again spun on the seed layer 304 to form a second photoresist layer 308 of a second thickness, which may be determined according to the desired height dimension of the second metal feature to be formed over the second metal bond pad 321. A second mask layer 309 is next placed over the second photoresist layer 308. The second mask layer 309 may also be a photolithographic mask including transparent portions that allow light to pass through and opaque portions for blocking the passage of light. The transparent portions may be disposed directly over at least portions of the second metal bond pads 321. Light beam is projected on the second mask layer 309 to expose portions of the second photoresist layer 308 directly under the transparent portions, i.e., the seed layer 304 substantially directly over the second metal bond pads 321, and unexposed portions of the second photoresist layer 308 directly under the opaque portions to form the second openings 310. The opening area of the second opening 310 can be freely determined depending on the desired size of the bottom of the second metal feature on the second metal bond pad 321.

Figure 5H:
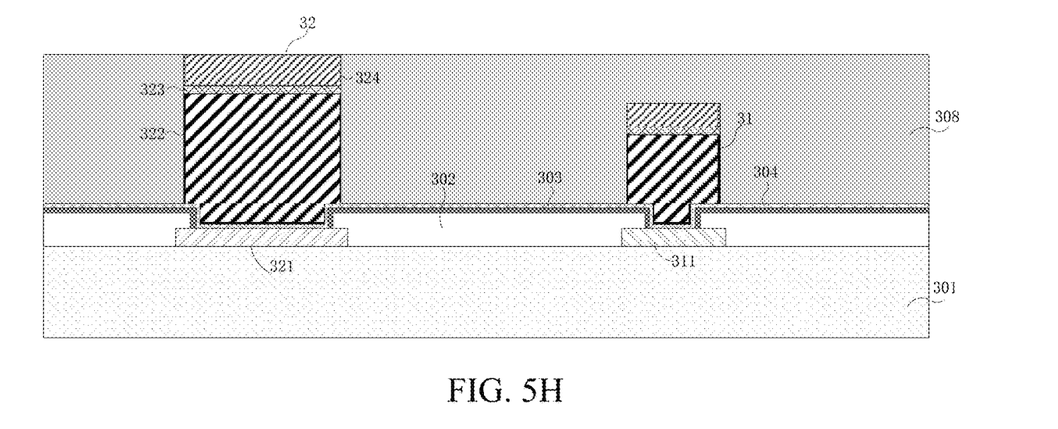

As shown in FIG. 5H, a second metal feature of a second height is then formed in the second opening 310. In some embodiments, referring to FIG. 5G, the second metal feature may be a second under-bump metal 32. Optionally, the second metal feature may also be other metal interfaces for providing electrical interconnection of the chip. The present embodiment is described by taking the under-bump metallization as an example but is not limit to this example.

Referring to FIG. 5H, a same or similar process as the first under bump metallization 31 is followed to form a second under bump metallization 32 of a second height above the seed layer and in the second opening 310, typically by performing an electroplating process to fill the second opening 310 with a metal material to form the second under bump metal 32. In some embodiments, the second height is substantially equal to the second thickness of the second photoresist layer 308 at the third opening. The bottom of the second under-bump metal 32 is electrically connected to the second metal bond pad 32 through the seed layer 304. According to some embodiments, the step of forming the second under bump metal 32 may specifically include: forming a copper (Cu)-containing layer 322, which may be, for example, a copper pillar, over the seed layer 304 and in the second opening 310 by electroplating, forming a nickel (Ni)-containing layer 323 over the copper (Cu)-containing layer 322, and forming a solder paste layer 324, which may be, for example, a tin-silver compound layer (e.g., snag1.8%), such as snag1.8%, over the nickel (Ni)-containing layer 323.

After forming the second metal feature, the second photoresist layer 308 is removed. For example, the second photoresist layer 308 may be removed in a photoresist stripping process, similar to the removal process for removing the first photoresist layer 305. The resulting structure is shown in FIG. 5I.

Figure 5I:
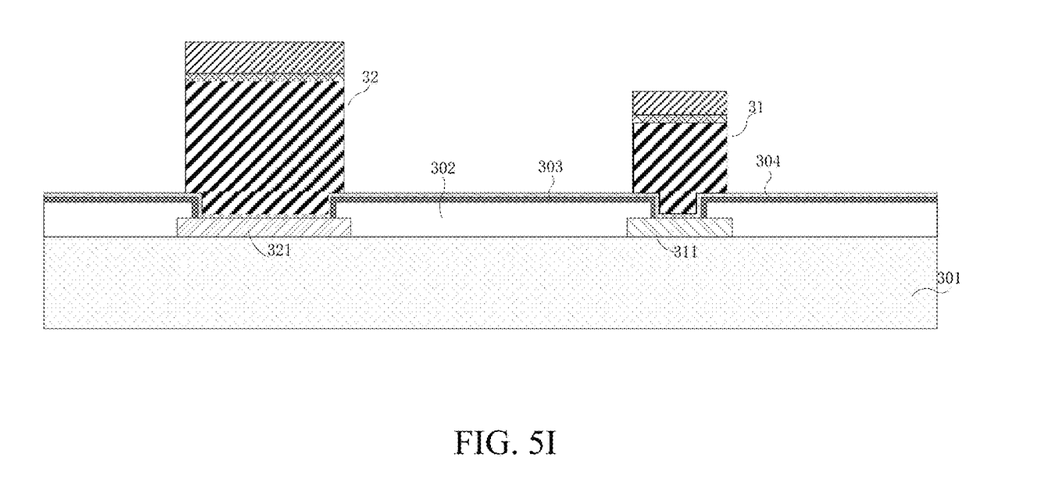
Figure 5J:
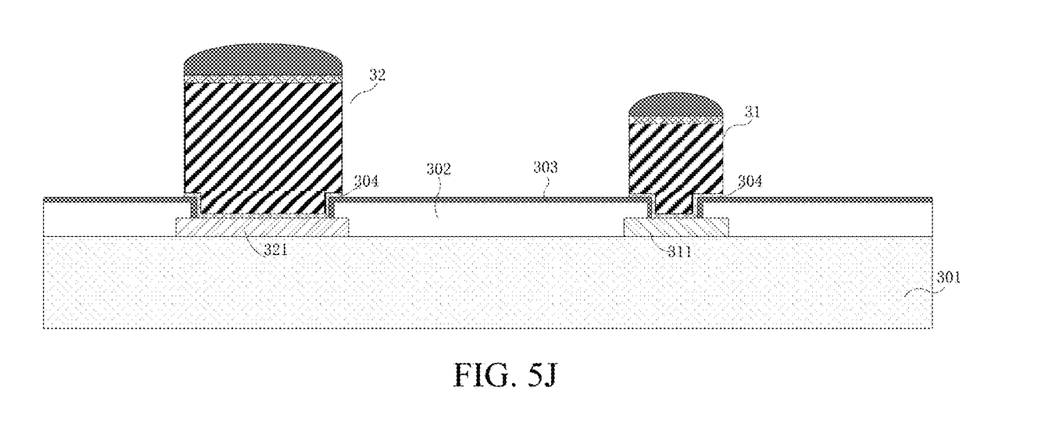

In some embodiments, referring to FIG. 5I, the exposed portions of the seed layer 304 previously covered by the photoresist is next removed by etching, while the unexposed portions of seed layer 304 covered by first under-bump metal 11 and second under-bump metal 32 remain.

The solder pastes 314 and 324 previously dispensed on top of the metal bond pad are re-melted by a reflow soldering process, resulting in the solder bumps shown in FIG. 5J due to the liquid surface tension of the melted material.

It can be understood that if the second metal bond pad 321 with a larger size is desired to have a lower metal feature, the above steps may be reversed, that is, the mask opening at the second metal bond pad 321 is firmed in the photoresist 305 to form the second metal feature (in the illustration, the second under bump metal 32) on the second metal bond pad 321, and then the mask opening at the first metal bond pad 311 is formed in the photoresist 308 to form the first metal feature (in the illustration, the first under bump metal 31) on the first metal bond pad 311, which will not be described again.

While the above-described embodiments are described with reference to FIGS. 5A-5J, which show a single first metal feature and a single second metal feature, it is to be understood that a semiconductor device including a plurality of first metal features and second metal features having different sizes and heights can be formed based on the spirit of the method described above. In other words, more than two metal features with different sizes and heights can be formed, although not shown in FIGS. 5A-5J for ease of illustration.

According to various aspects of the above embodiments, by employing the unique process flow of the above-described bump forming process, a variety of bumps of different sizes and controlled bump heights can be formed on a semiconductor device, which is very valuable for the integration of ASIC bare chips and chiplets using high density interconnect routing in the same package.

According to some embodiments, by integrally attaching several chips having different bump heights above the semiconductor substrate and the interconnection device, a simple packaging process and low packaging cost with high-density interconnection wiring inside the package can be achieved.

In some embodiments, a semiconductor package is manufactured and formed by adopting the method of certain embodiments.

Referring to FIG. 2, the semiconductor package includes: a semiconductor substrate 10, an interconnect device 20 attached to an upper surface of the semiconductor substrate, and at least two chips 30. In some embodiments, at least one first conductive bump 31 and at least one second conductive bump 32 are formed on a front surface of each chip 30, and the second conductive bump 32 is higher than the first conductive bump 31. In some embodiments, the at least two chips 30 are attached to the semiconductor substrate and the upper surface of the interconnect device 20, with the second conductive bump(s) 32 of each chip 30 bonded to the upper surface of the semiconductor substrate and the first conductive bump(s) 31 of each chip 30 bonded to the upper surface of the interconnect device 20.

In some embodiments, referring to FIG. 4A, the interconnect device 20 includes: a silicon wafer layer 21 (which can be a segmented portion of a silicon wafer), the silicon wafer layer 21 having opposing first and second sides; a redistribution layer (RDL) structure 22 attached to a first side of the silicon wafer layer 21; and a plurality of first bonding pads 23 formed on the surface of the RDL structure 22. In some embodiments, the thickness of the interconnection device 20 is determined according to a height difference between the first conductive bump 31 and the second conductive bump 32 on a semiconductor device 30.

In other embodiments, referring to FIG. 4B, a plurality of vertical Through Silicon Vias (TSVs) 24 are formed between the first side and the second side of the Silicon wafer. Alternatively, the interconnect device with vertical through-silicon-vias 24 may have its second side attached to the semiconductor substrate using a Hybrid Bonding process, thereby achieving higher interconnect density.

In some embodiments, as shown in FIG. 5J, chip 30 includes a semiconductor device. In some embodiments, the semiconductor device comprises a semiconductor substrate 301 and at least two metal bonding pads 311, 312 positioned above the semiconductor substrate 301; a seed layer 304 formed on the upper surface of the semiconductor device and electrically connected to each metal pad; at least one first conductive bump 31 having a first height formed over the seed layer 304 and directly over at least a portion of at least one first metal pad 311 of the at least two metal pads; at least one second conductive bump 32, having a second height formed over the seed layer 304 and directly over at least a portion of at least one second metal pad 321 of the at least two metal pads.

In some embodiments, the semiconductor device further comprises a passivation layer 302 formed over the semiconductor substrate 301 and the at least two metal pads, and a patterned opening in the passivation layer exposes at least a portion of each of the metal pads to be in contact with the seed layer 304. In other words, the seed layer 304 covers at least the exposed surface of each metal pad.

In some embodiments, the semiconductor device further comprises a polymer layer 303 formed on a surface of the passivation layer.

In some embodiments, the thicknesses of the first and second conductive bumps 31, 32 are different.

In some embodiments, a plurality of second bonding pads are formed over the semiconductor substrate 10, wherein the plurality of first conductive bumps 31 of each chip 30 are bonded to the plurality of first bonding pads of the interconnection device 20, and the plurality of second conductive bumps 32 of each chip 30 are bonded to the plurality of second bonding pads exposed at the upper surface of the semiconductor substrate 10.

In some embodiments, the first and second conductive bumps 31 and 32 include an under-bump metal.

In some embodiments, referring to FIG. 3, the package further comprises: a cap 40 attached over the semiconductor substrate, the cap 40 housing the interconnection device 20 and the at least two chips 30 therein; and a grid array is formed under the semiconductor substrate for bonding the package to a PCB board 60.

While the spirit and principles of the invention have been described with reference to several particular embodiments, it is to be understood that the invention is not limited to the disclosed embodiments, nor is the division of aspects, which is for convenience only as the features in such aspects may not be combined to benefit. The invention is intended to cover various modifications and equivalent arrangements included within the spirit and scope of the appended claims.

What is claimed is:

1. A method of forming a semiconductor package, comprising:
   attaching an interconnect device to a semiconductor substrate; and
   flip-chip mounting at least two chips over the interconnect device and the semiconductor substrate, wherein each respective chip of the at least two chips includes at least one first conductive bump of a first height and at least one second conductive bump of a second height formed on a front side of the respective chip, wherein the second height is greater than the first height, and wherein flip-chip mounting the at least two chips over the interconnect device and the semiconductor substrate includes bonding the at least one second conductive bump of the respective chip to the semiconductor substrate while bonding the at least one first conductive bump of the respective chip to the interconnect device;
   wherein attaching the interconnect device to the semiconductor substrate comprises:
   attaching the interconnect device to a surface of the semiconductor substrate using a hybrid bonding process.

2. The method of claim 1, further comprising, prior to attaching the interconnect device over the semiconductor substrate, forming the interconnect device, including:
   providing a silicon wafer having a first side and an opposing second side;
   forming a redistribution layer structure on the first side of the silicon wafer;
   forming a plurality of first bonding pads on the redistribution layer structure;
   thinning the silicon wafer from the second side thereof to a thickness corresponding to a height difference between the at least one first conductive bump and the at least one second conductive bump; and
   dicing the silicon wafer to obtain the interconnect device.

3. The method of claim 2, further comprising forming vertical through-silicon vias between the first side and the second side of the silicon wafer.

4. The method of claim 2, wherein thinning the silicon wafer from the second side comprises:
   temporarily adhering the first side of the silicon wafer to a support wafer to support the silicon wafer during thinning; and
   removing the support wafer after thinning;
   wherein the support wafer is a silicon wafer or a glass substrate.

5. The method of claim 1, wherein the at least one first conductive bump and the at least one second conductive bump are formed on the respective chip in a process comprising:
   providing a semiconductor wafer having at least one semiconductor device formed thereon, the at least one semiconductor device including a plurality of metal bond pads, the plurality of metal bond pads including a first metal bond pad and a second metal bond pad;
   forming a seed layer over the at least one semiconductor device, the seed layer being electrically connected to each of the plurality of metal bond pads;
   forming a first photoresist layer over the seed layer, the first photoresist layer having a first thickness corresponding to the first height;
   forming a first set of openings in the first photoresist layer, the first set of openings including a first opening exposing a first portion of the seed layer directly over at least a portion of the first metal bond pad of the plurality of metal bond pads;
   forming a first metal feature of the first height in the first opening;
   removing the first photoresist layer;
   forming a second photoresist layer over the seed layer after removing the first photoresist layer, the second photoresist layer having a second thickness corresponding to the second height and different from the first thickness;
   forming a second set of openings in the second photoresist layer, the second set of openings including a second opening exposing a second portion of the seed layer directly over at least a portion of the second metal bond pad of the plurality of metal bond pads;
   forming a second metal feature of the second height in the second opening;
   removing the second photoresist layer; and
   etching away exposed portions of the seed layer after removing the second photoresist layer.

6. The method of claim 5, wherein the process further comprises:
   before forming the seed layer, forming a patterned passivation layer over the semiconductor wafer and the plurality of metal bond pads, the passivation layer exposing at least a portion of each of the metal bond pads, wherein the seed layer subsequently covers exposed portion of each of the metal bond pads; and
   after forming the patterned passivation layer, forming a polymer layer on the passivation layer.

7. The method of claim 5, wherein forming the second photoresist layer over the seed layer includes, after the removing the first photoresist layer, forming the second photoresist layer over the seed layer to completely cover the first metal feature.

8. The method of claim 5, wherein the first metal feature and the second metal feature include under-bump metal.

9. The method of claim 5, wherein the second metal bond pad is larger in size than the first metal bond pad.

10. The method of claim 1, wherein after flip-chip mounting the at least two chips to the semiconductor substrate and the interconnect device, the method further comprising:
    attaching a cap over the semiconductor substrate, the cap housing the interconnect device and the at least two chips therein; and
    forming a ball grid array under the semiconductor substrate, the ball grid array configured to bond the semiconductor substrate to an printed circuit board (PCB) board.

11. The method of claim 1, wherein the interconnect device includes a segmented portion of a silicon wafer or a glass substrate.

12. The method of claim 1, wherein:
    the interconnect device has an upper side and an opposing lower side;

the semiconductor substrate has an upper side and an opposing lower side;

the lower side of the interconnect device is attached to the upper side of the semiconductor substrate;

the upper side of the interconnect device has a plurality of first bond pads formed thereon;

the upper side of the semiconductor substrate has a plurality of second bond pads formed thereon;

the at least one first conductive bump includes a plurality of first conductive bumps;

the at least one second conductive bump includes a plurality of second conductive bumps; and flip-chip mounting the at least two chips over the semiconductor substrate and the interconnect device includes concurrently bonding the plurality of first conductive bumps of the respective chip to corresponding first bond pads on the upper side of the interconnect device and the plurality of second conductive bumps of the respective chip to corresponding second bond pads on the upper side of the semiconductor substrate.

13. The method of claim 12, wherein the plurality of first conductive bumps are bonded to the corresponding first bond pads and the plurality of second conductive bumps are bonded to the corresponding second bond pads by thermocompression bonding.

14. The method of claim 12, wherein the semiconductor substrate further includes BGA pads formed on the lower side of the semiconductor substrate, and vias and/or through-holes in the semiconductor substrate interconnecting the BGA pads and the plurality of second bond pads.

* * * * *